United States Patent
Shin et al.

(10) Patent No.: US 9,337,839 B2
(45) Date of Patent: May 10, 2016

(54) PRE-DRIVER AND POWER CIRCUIT INCLUDING THE SAME

(71) Applicant: SILICON WORKS CO., LTD., Daejeon-si (KR)

(72) Inventors: Yoon Soo Shin, Seoul (KR); Jeong Kwang Lee, Seongnam-si (KR)

(73) Assignee: SILICON WORKS CO., LTD., Daejeon-Si (KR)

( * ) Notice: Subject to any disclaimer, the term of this patent is extended or adjusted under 35 U.S.C. 154(b) by 0 days.

(21) Appl. No.: 14/555,037

(22) Filed: Nov. 26, 2014

(65) Prior Publication Data

US 2015/0155871 A1    Jun. 4, 2015

(30) Foreign Application Priority Data

Nov. 29, 2013  (KR) .................. 10-2013-0147822

(51) Int. Cl.
*H03L 5/00*   (2006.01)
*H03K 19/0175*   (2006.01)

(52) U.S. Cl.
CPC .................. *H03K 19/0175* (2013.01)

(58) Field of Classification Search
USPC ........................................... 327/333
See application file for complete search history.

(56) References Cited

U.S. PATENT DOCUMENTS

2010/0214001 A1*  8/2010  Lee ............. H03K 19/0185
                                            327/333
2011/0181573 A1*  7/2011  Lee ............. G09G 3/3611
                                            345/211

FOREIGN PATENT DOCUMENTS

KR    10-2011-0074352    6/2011

* cited by examiner

*Primary Examiner* — Long Nguyen
(74) *Attorney, Agent, or Firm* — Kile Park Reed & Houtteman PLLC

(57) ABSTRACT

Disclosed are a pre-driver having a modified circuit for gate pulse modulation and a power circuit including the same. The pre-driver includes a level shifter that outputs pulses having a phase difference and a gate pulse modulator that performs gate pulse modulation. The gate pulse modulator outputs a modulated gate pulse obtained by modulating a pulse by a reference voltage, and has a structure in which the number of switches provided therein is reduced.

20 Claims, 9 Drawing Sheets

PRE-DRIVER AND POWER CIRCUIT INCLUDING THE SAME

BACKGROUND

1. Technical Field

The present invention relates to a gate pulse modulation technology, and more particularly, to a pre-driver including a modified circuit for gate pulse modulation and a power circuit including the same.

2. Related Art

A liquid crystal display (LCD) is a kind of a display apparatus, and may display texts or images by an optical shutter operation using liquid crystals.

A TFT-LCD using a thin film transistor (TFT), which is an active element, may realize a large screen display with high quality and high brightness. In the TFT-LCD, it is necessary to drive the TFT at a high voltage in order to improve the characteristics of the TFT with low mobility. However, in the case of driving the TFT through a square wave of a high voltage, power consumption may increase, and an abnormal effect such as flicker and crosstalk may occur.

In order to overcome such problems, various technologies have been developed, and an example thereof is disclosed in Korea Unexamined Patent Publication No. 10-2011-0074352.

SUMMARY

Various embodiments are directed to a pre-driver capable of reducing a circuit area by reducing the number of switches used in gate pulse modulation, and a power circuit including the same.

Also, various embodiments are directed to a pre-driver capable of reducing a circuit area by outputting modulated gate pulses having a phase difference by using a shared switch, and a power circuit including the same.

Further, various embodiments are directed to a pre-driver capable of reducing a circuit area by being configured to output modulated gate pulses having a phase difference not causing overlap of driving times, in an order according to original phase, by using a shared switch, and a power circuit including the same.

In an embodiment, a pre-driver may include: a level shifter including first and second output terminals which respectively output first and second pulses to have a phase difference, the first and second pulses having first and second voltages respectively; and a gate pulse modulator including a first switch to which a reference voltage having a level between the first voltage and the second voltage is applied and first second and second second switches which are commonly connected to the first switch, the first second switch being connected to the first output terminal and the second second switch being connected to the second output terminal, the gate pulse modulator being configured to provide the reference voltage to the first output terminal through the first switch and the first second switch in correspondence to shift of the first pulses and provide the reference voltage to the second output terminal through the first switch and the second second switch in correspondence to shift of the second pulses, wherein modulated gate pulses generated as the first and second pulses are modulated by the reference voltage are outputted.

In an embodiment, a power circuit may include: a power unit configured to provide a first voltage, a second voltage, and a reference voltage which has a level between the first voltage and the second voltage; and a pre-driver configured to output modulated gate pulses by using the first voltage, the second voltage and the reference voltage.

According to the embodiments, it is possible to design a pre-driver such that the number of switches for the output of overall modulated gate pulses can be reduced by outputting different modulated gate pulses by a shared switch, so that it is possible to reduce the manufacturing cost of the pre-driver or a power circuit including the pre-driver. Furthermore, in the pre-driver or the power circuit according to the present invention, the number of switches is reduced, resulting in the reduction of a circuit area.

Also, according to the embodiments, when the pre-driver or the power circuit is realized in the form of a chip, the number of switches is reduced, so that an internal space can be endured and the internal space in the chip can be utilized to remove signal interference. Consequently, it is possible to improve the characteristics of signals in the chip.

DETAILED DESCRIPTION

Figure 1:
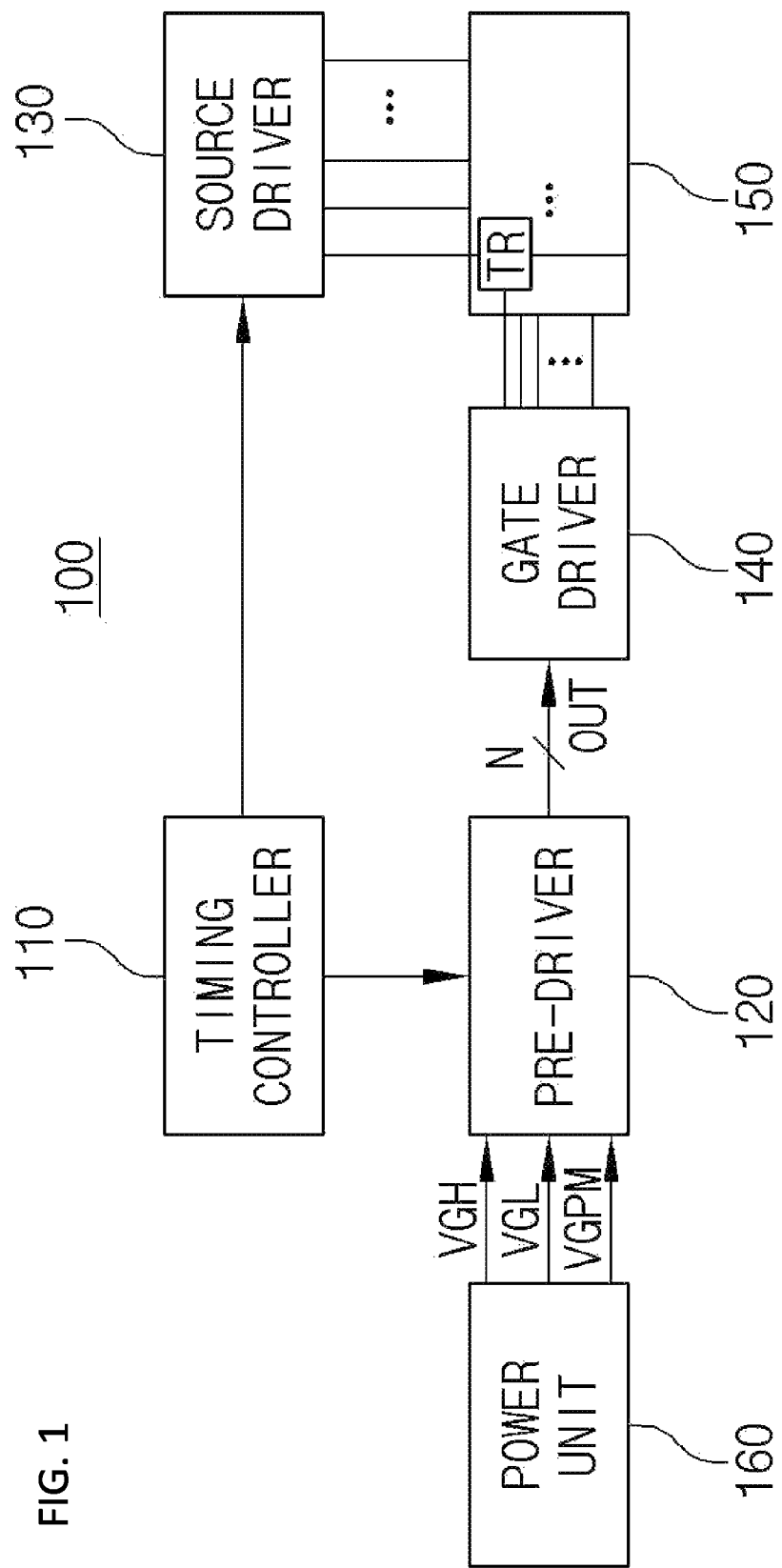
FIG. 1 is a block diagram illustrating a display apparatus to which the present invention is applied.

Exemplary embodiments will be described below in more detail with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

The present invention discloses a technology that is applied to a display apparatus such as a liquid crystal display apparatus.

Referring to FIG. 1, a display apparatus 100 includes a timing controller 110, a pre-driver 120, a source driver 130, a gate driver 140, a display panel 150, and a power unit 160. The display panel 150 is assumed to include a liquid crystal display panel in order to describe the embodiments of the present invention. The power unit 160 is configured to provide various levels of voltages necessary for the operations of the timing controller 110, the source driver 130, the pre-driver 120, and the gate driver 140. For the purpose of convenience, FIG. 1 illustrates that the power unit 160 provides the pre-driver 120 with only a first voltage VGL having a level for gate-off, a second voltage VGH having a level for gate-on, and a reference voltage VGPM having a level between the levels of the first voltage VGL and the second voltage VGH.

The timing controller 110 provides a plurality of timing signals to the pre-driver 120 and the source driver 130. The plurality of timing signals may be used for controlling the operations of the pre-driver 120, the source driver 130, and the gate driver 140.

The pre-driver 120 may receive the plurality of timing signals for gate pulse driving from the timing controller 110, perform gate pulse modulation by the plurality of timing signals, and generate and output modulated gate pulses by the gate pulse modulation. The gate pulse modulation may include a process in which a square wave is modulated such that, when a pulse shifts, the pulse shifts to a target level via an intermediate voltage. The pre-driver 120 will be described with reference to FIG. 3.

The source driver 130 receives a timing signal for driving a data signal from the timing controller 110, and provides a data signal for displaying an image to the display panel 150.

The gate driver 140 receives the modulated gate pulses provided from the pre-driver 120, and provides a gate pulse to the display panel 150 through the modulated gate pulses.

Figure 2:
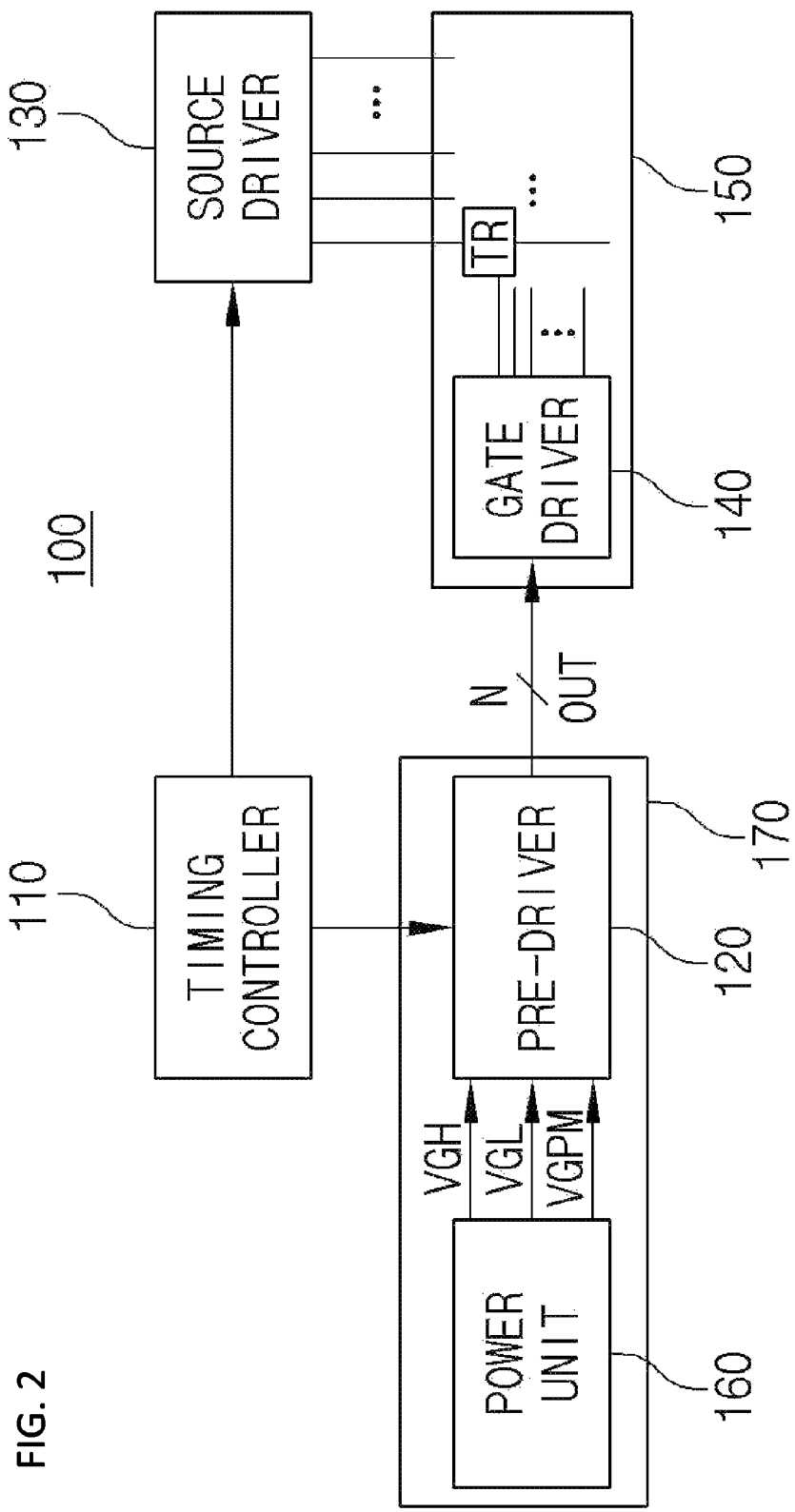
FIG. 2 is a block diagram illustrating another display apparatus to which the present invention is applied.

The gate driver 140 may be separately provided outside the display panel 150 as illustrated in FIG. 1, or may be provided in the form of a module on the display panel 150 through a GIP (Gate In Panel) method as illustrated in FIG. 2. In the GIP method, the driving performance of the display panel 150 may be reduced by the gate driver 140, but the manufacturing cost may be saved.

The display panel 150 may display images by the data signal of the source driver 130 and the gate pulse of the gate driver 140. A 'TR' in the display panel 150 indicates a thin film transistor (TFT) to which the data signal and the gate pulse are applied, and the data signal is transferred to a liquid crystal element by the operation of the thin film transistor. A liquid crystal element forming a pixel may be driven corresponding to the data signal.

The embodiment of FIG. 1 exemplifies the display apparatus 100 in which the power unit 160, the pre-driver 120, and the gate driver 140 are provided in separate chips, respectively.

However, the gate driver 140 may be provided in the form of a module on the display panel 150 through a GIP method as illustrated in FIG. 2. In this case, as illustrated in FIG. 2, the power unit 160 and the pre-driver 120 may be included in a power circuit 170 provided in one chip.

The configuration of FIG. 2 is substantially the same as that of FIG. 1, except that the gate driver 140 is provided in the form of a module on the display panel 150 through a GIP method and the power unit 160 and the pre-driver 120 are included in the power circuit 170. Accordingly, for the purpose of convenience, a description of FIG. 2 will be omitted.

Figure 3:
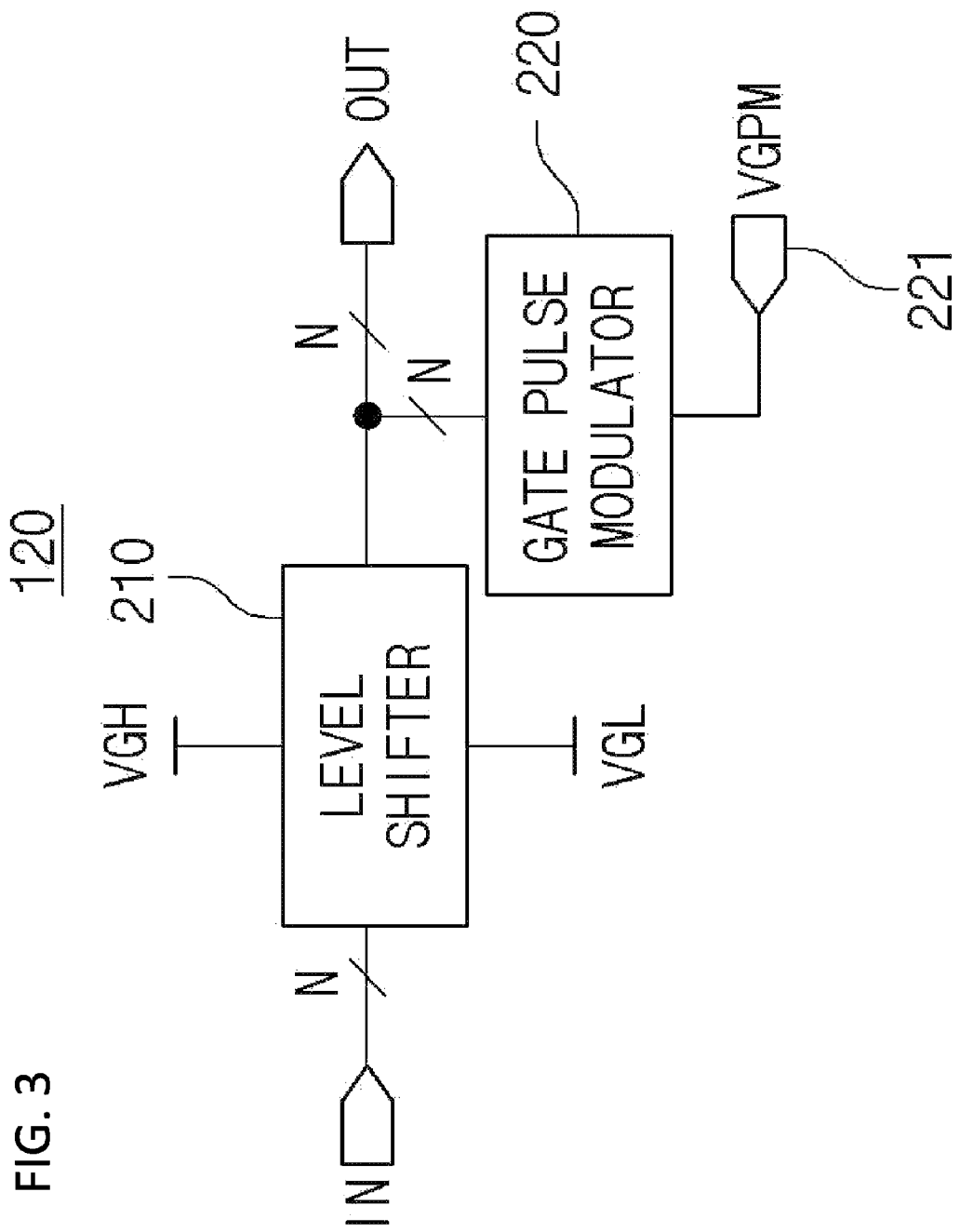
FIG. 3 is a block diagram illustrating a preferred embodiment of a pre-driver according to the present invention.

The pre-driver 120 may include a level shifter 210 and a gate pulse modulator 220 as illustrated in FIG. 3.

The level shifter 210 outputs pulses that are swung between a first level and a second level in correspondence with timing signals IN provided from the timing controller 110, wherein the pulses outputted from the level shifter 210 have phases different from one another. The first level may be decided by the first voltage VGL, and the second level may be decided by the second voltage VGH higher than the first voltage VGL. A period in which a pulse maintains the second level decided by the second voltage VGH may be defined as a gate enable period. That is, the gate enable period may be defined as a period of maintaining the second voltage VGH that is a gate-on voltage.

The level shifter 210 may sequentially output phase-delayed pulses. In one embodiment, the level shifter 210 may output 4, 6, or 8 phase-delayed pulses. When the level shifter 210 outputs four pulses (N=4), the four pulses may have phases different from one another.

The gate pulse modulator 220 is connected between a gate pulse modulation terminal 221 to which the reference voltage VGPM is applied, and an output terminal of the level shifter 210.

The gate pulse modulator 220 controls the level of the output terminal of the level shifter 210 such that the levels of pulses are shifted from the first voltage VGL to the second voltage VGH via the reference voltage VGPM, or from the second voltage VGH to the first voltage VGL via the reference voltage VGPM.

The reference voltage VGPM of the gate pulse modulation terminal 221 may be adjusted according to the characteristics of the driven display panel 150. The reference voltage VGPM may be adjusted by connecting a resistor or a diode between an output terminal of the power unit 160 or an external power unit and the gate pulse modulation terminal 221.

Figure 4:
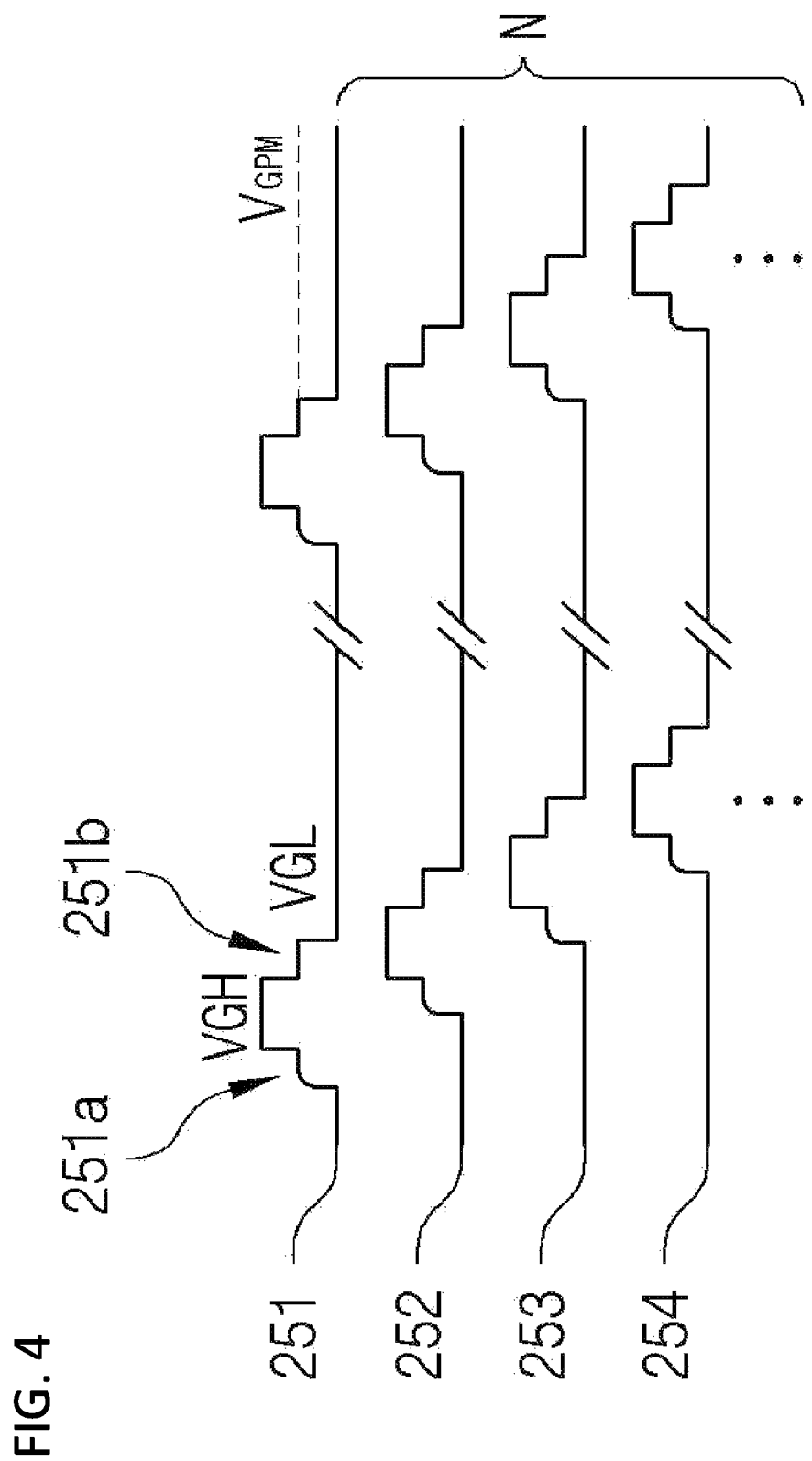
FIG. 4 is a waveform diagram of modulated gate pulses outputted from a pre-driver of FIG. 3.

By the aforementioned configuration, the pulses outputted from the level shifter 210 are modulated under the control of the gate pulse modulator 220. As a result, the pre-driver 120 outputs modulated gate pulses 251 to 254 as illustrated in FIG. 4.

The gate pulse modulator 220 will be described in detail with reference to FIG. 5 to FIG. 9.

Figure 5:
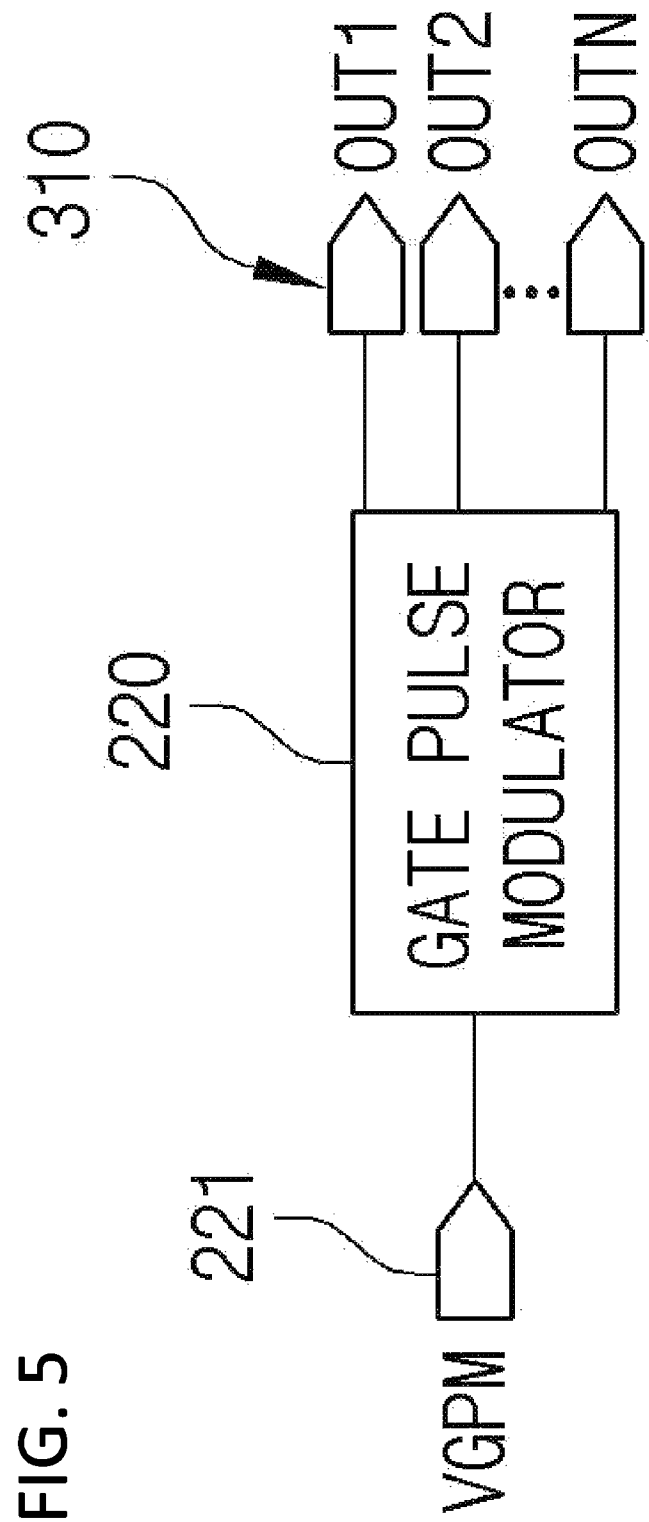
FIG. 5 is a block diagram of a gate pulse modulator of FIG. 3.

FIG. 5 is a block diagram of the gate pulse modulator 220 of FIG. 3.

In FIG. 5, the gate pulse modulator 220 may output pulses for improving the operation efficiency of the thin film transistor (TFT) on the display panel 150, and may be connected between the gate pulse modulation terminal 221 that outputs the reference voltage VGPM and the output terminal of the level shifter 210.

A TFT-LCD needs to be driven at a high voltage due to the characteristics of a thin film transistor with low mobility. However, when the TFT-LCD is driven at a high voltage for the thin film transistor, power consumption may increase, and abnormal effects (flicker, crosstalk or the like) may occur due to internal coupling. The gate pulse modulator 220 converts the pulse outputted from the level shifter 210 into a step-like modulate gate pulse that passes through the reference voltage VGPM. As a result, the abnormal effects (flicker, crosstalk or the like) may be prevented from occurring.

The output terminals 310 of the gate pulse modulator 220 are connected to the output terminals of the level shifter 210, respectively. That is, when the number of the output terminals of the level shifter 210 is N, the gate pulse modulator 220 also has N output terminals.

Figure 6:
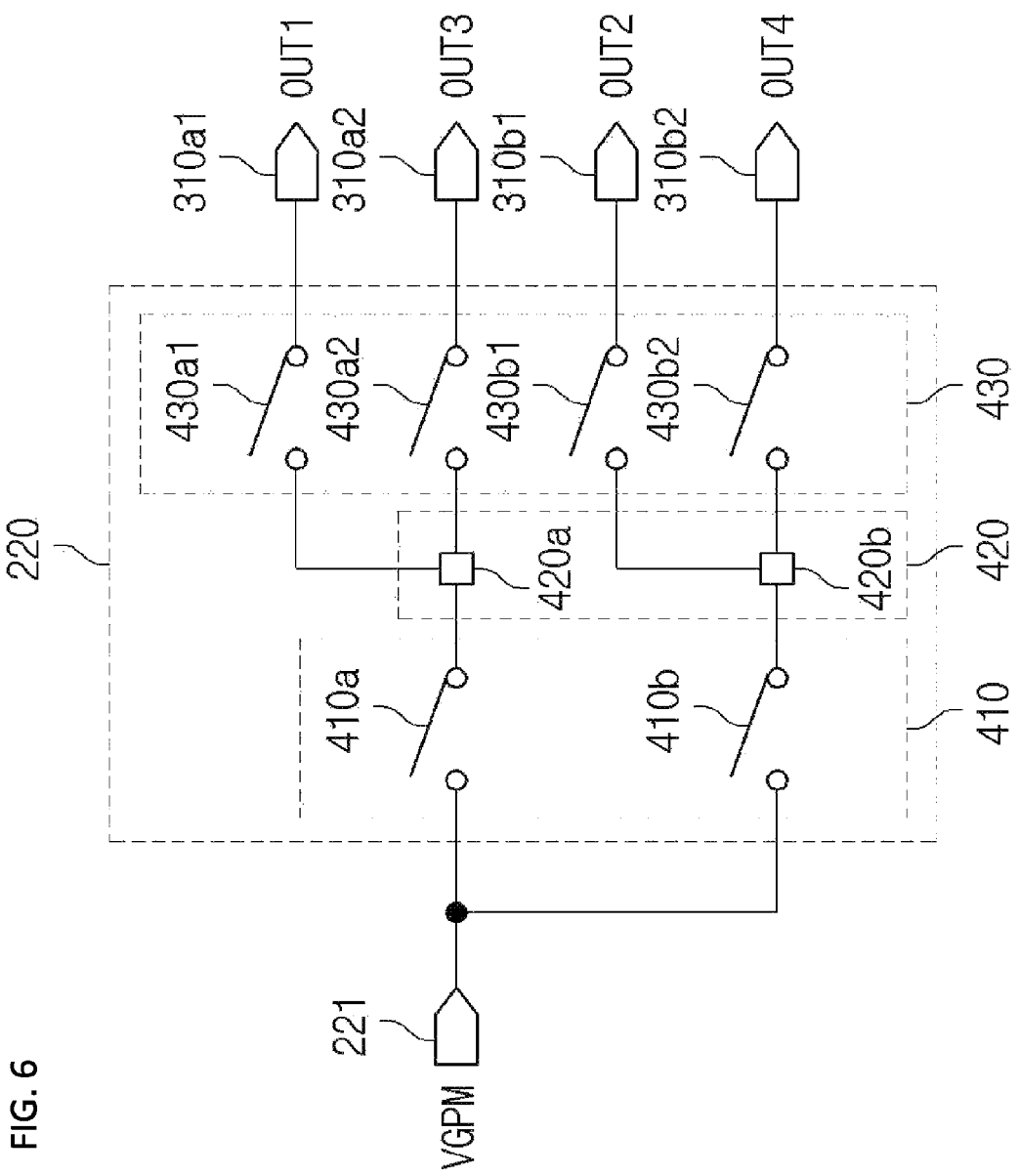
FIG. 6 is a circuit diagram illustrating an embodiment of a gate pulse modulator of FIG. 3.

FIG. 6 is a circuit diagram corresponding to one embodiment of the gate pulse modulator 220 of FIG. 3 and FIG. 5.

A first voltage having a level lower than that of the reference voltage VGPM or a second voltage having a level higher than that of the reference voltage VGPM may be applied to the output terminal of the level shifter 210. In this regard, in the gate pulse modulator 220, a pair of switches should be provided to correspond to each output terminal of the level shifter 210 in order to provide a first path for the first voltage and a second path for the second voltage. That is, a pair of switches should be provided between the gate pulse modulation terminal 221 and each output terminal of the level shifter 210.

In the embodiment of the present invention, switches, which are connected to the gate pulse modulation terminal 221 to which the reference voltage VGPM is applied, are provided to correspond to two output terminals of the level shifter 210. The embodiment of the present invention has a structure of sharing a switch to which the reference voltage VGPM, so that the number of switches included in the gate pulse modulator 220 can be reduced and thus an internal space can be ensured.

With reference to FIG. 6, the structure of the gate pulse modulator 220 will be described. The gate pulse modulator 220 of FIG. 6 includes a first switch group 410, a common node group 420, and a second switch group 430. FIG. 6 exemplifies the case in which the number of the output terminals of the level shifter 210 is 4.

The first switch group 410 includes two first switches 410a and 410b connected in parallel to the gate pulse modulation terminal 221 to which the reference voltage VGPM is applied, the common node group 420 includes common nodes 420a and 420b, and the second switch group 430 includes four second switches 430a1, 430a2, 430b1, and 430b2.

In the first switch group 410, the first switch 410a is provided between the gate pulse modulation terminal 221 and the common node 420a, and the first switch 410b is provided between the gate pulse modulation terminal 221 and the common node 420b.

The first switch 410a and the pair of second switches 430a1 and 430a2 are connected to each other through the common node 420a. The first switch 410b and the pair of second switches 430b1 and 430b2 are connected to each other through the common node 420b.

In the second switch group 430, the second switch 430a1 is provided between the common node 420a and an output terminal 310a1 of the level shifter 210, the second switch 430a2 is provided between the common node 420a and an output terminal 310a2 of the level shifter 210, the second switch 430b1 is provided between the common node 420b and an output terminal 310b1 of the level shifter 210, and the second switch 430b2 is provided between the common node 420b and an output terminal 310b2 of the level shifter 210.

As described above, the first switch group 410 includes the two first switches and the second switch group 430 includes the four second switches. That is, the first switch group 410 may include first switches reduced to ½ of the number of the second switches included in the second switch group 430.

FIG. 6 exemplifies the case in which the number of the output terminals of the level shifter 210 is 4, wherein the first switch 410a may be sequentially connected to the second switches 430a1 and 430a2, and the first switch 410b may be sequentially connected to the second switches 430b1 and 430b2. That is, the first switch 410a may be sequentially connected to OUT1 and OUT3 through the second switches 430a1 and 430a2, respectively, and the first switch 410b may be sequentially connected to OUT2 and OUT4 through the second switches 430b1 and 430b2, respectively.

Figure 7:
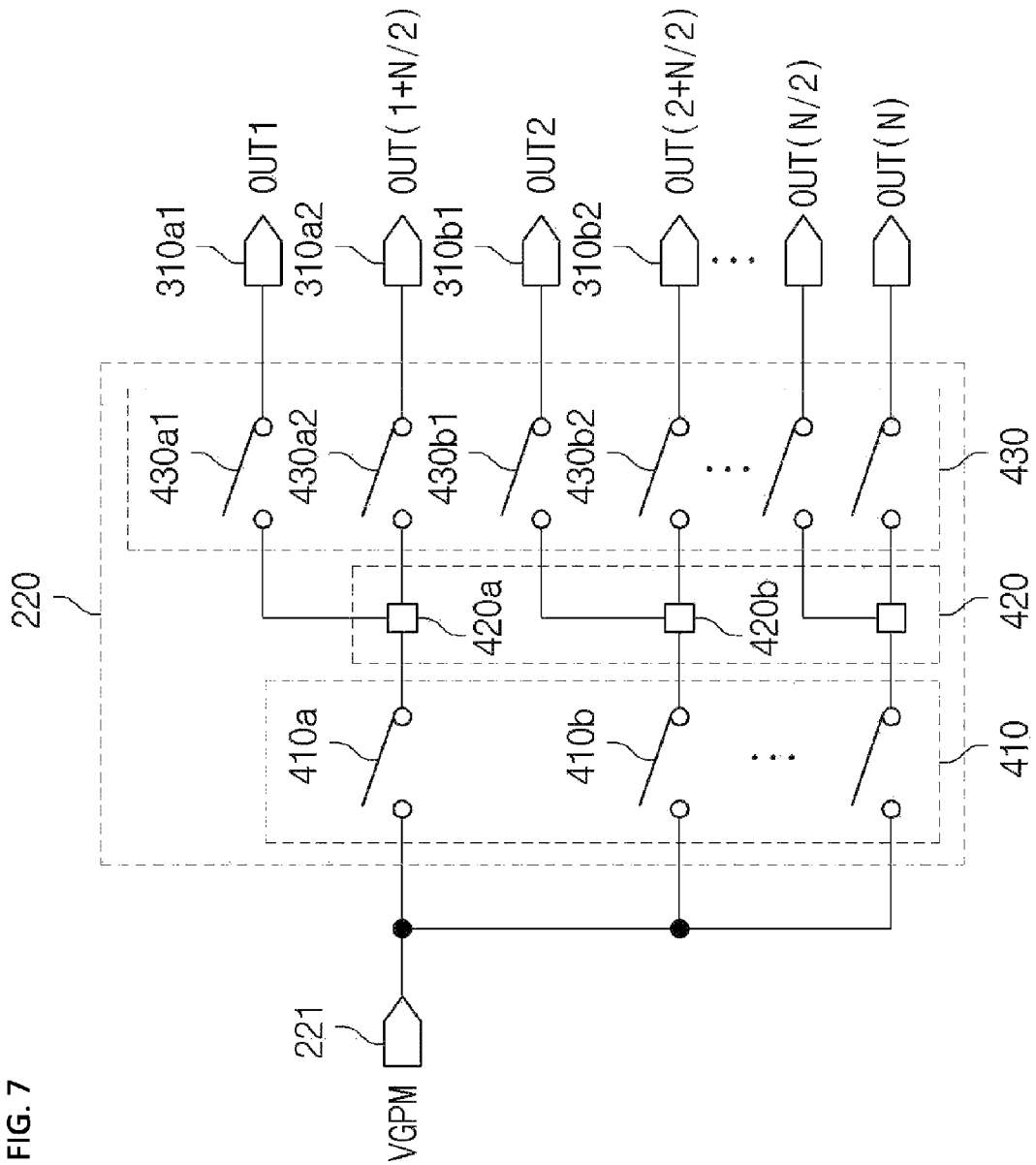
FIG. 7 is a circuit diagram illustrating another embodiment of a gate pulse modulator of FIG. 3.

FIG. 7 exemplifies the case in which the number of the output terminals of the level shifter 210 is N.

With reference to FIG. 7, the cases in which the number of the output terminals of the level shifter is 6 and 8 may also be described, respectively.

In the case in which the number of the output terminals of the level shifter is 6, the first switch 410a may be sequentially connected to the second switches 430a1 and 430a2, the first switch 410b may be sequentially connected to the second switches 430b1 and 430b2, and the first switch 410c may be sequentially connected to the second switches 430c1 and 430c2. That is, the first switch 410a may be sequentially connected to OUT1 and OUT4 through the second switches 430a1 and 430a2, respectively, the first switch 410b may be sequentially connected to OUT2 and OUT5 through the second switches 430b1 and 430b2, respectively, and the first switch 410c may be sequentially connected to OUT3 and OUT6 through the second switches 430c1 and 430c2, respectively.

In the case in which the number of the output terminals of the level shifter is 8, the first switch 410a may be sequentially connected to the second switches 430a1 and 430a2, the first switch 410b may be sequentially connected to the second switches 430b1 and 430b2, the first switch 410c may be sequentially connected to the second switches 430c1 and 430c2, and the first switch 410d may be sequentially connected to the second switches 430d1 and 430d2. That is, the first switch 410a may be sequentially connected to OUT1 and OUT5 through the second switches 430a1 and 430a2, respectively, the first switch 410b may be sequentially connected to OUT2 and OUT6 through the second switches 430b1 and 430b2, respectively, the first switch 410c may be sequentially connected to OUT3 and OUT7 through the second switches 430c1 and 430c2, respectively, and the first switch 410d may be sequentially connected to OUT4 and OUT8 through the second switches 430d1 and 430d2, respectively.

In one embodiment, the gate pulse modulator 220 may complete gate pulse modulation for first outputted N/2 pulses (hereinafter, referred to as a "first pulse group") among overall N pulses sequentially shifted and outputted from the level shifter 210, and then may perform gate pulse modulation for the other outputted N/2 pulses (hereinafter, referred to as a "second pulse group") subsequently sequentially shifted and outputted therefrom.

This is for preventing the switches of the first switch group 410 from performing gate pulse modulation for subsequently inputted pulses while performing gate pulse modulation for first inputted pulses. That is, one first switch included in the first switch group 410 may sequentially perform gate pulse modulation for two pulses having different phases and having different gate enable periods in which a pulse maintains a gate-on voltage.

In more detail, in the case in which the number of the output terminals of the level shifter is 4, the first switch 410a and the second switches 430a1 may complete gate pulse modulation for the OUT1, and the first switch 410a and the second switches 430a2 may perform gate pulse modulation for the OUT3. That is, a gate enable period of a pulse applied to the output terminal 310a1 of the level shifter 210 should not overlap a gate enable period of a pulse applied to the output terminal 310a2 of the level shifter 210. Similarly, the first switch 410b and the second switches 430b1 may complete gate pulse modulation for the OUT2, and the first switch 410b and the second switches 430b2 may perform gate pulse modulation for the OUT4. That is, a gate enable period of a pulse applied to the output terminal 310b1 of the level shifter 210 should not overlap a gate enable period of a pulse applied to the output terminal 310b2 of the level shifter 210.

As compared with the case in which the first switches are not commonly used, the gate pulse modulator 220 may be configured using switches having a number reduced to ¾. An area ensured through a decrease in the number of switches used can be used in order to improve signal characteristics, resulting in the improvement of the overall performance of the pre-driver 120.

Figure 8:
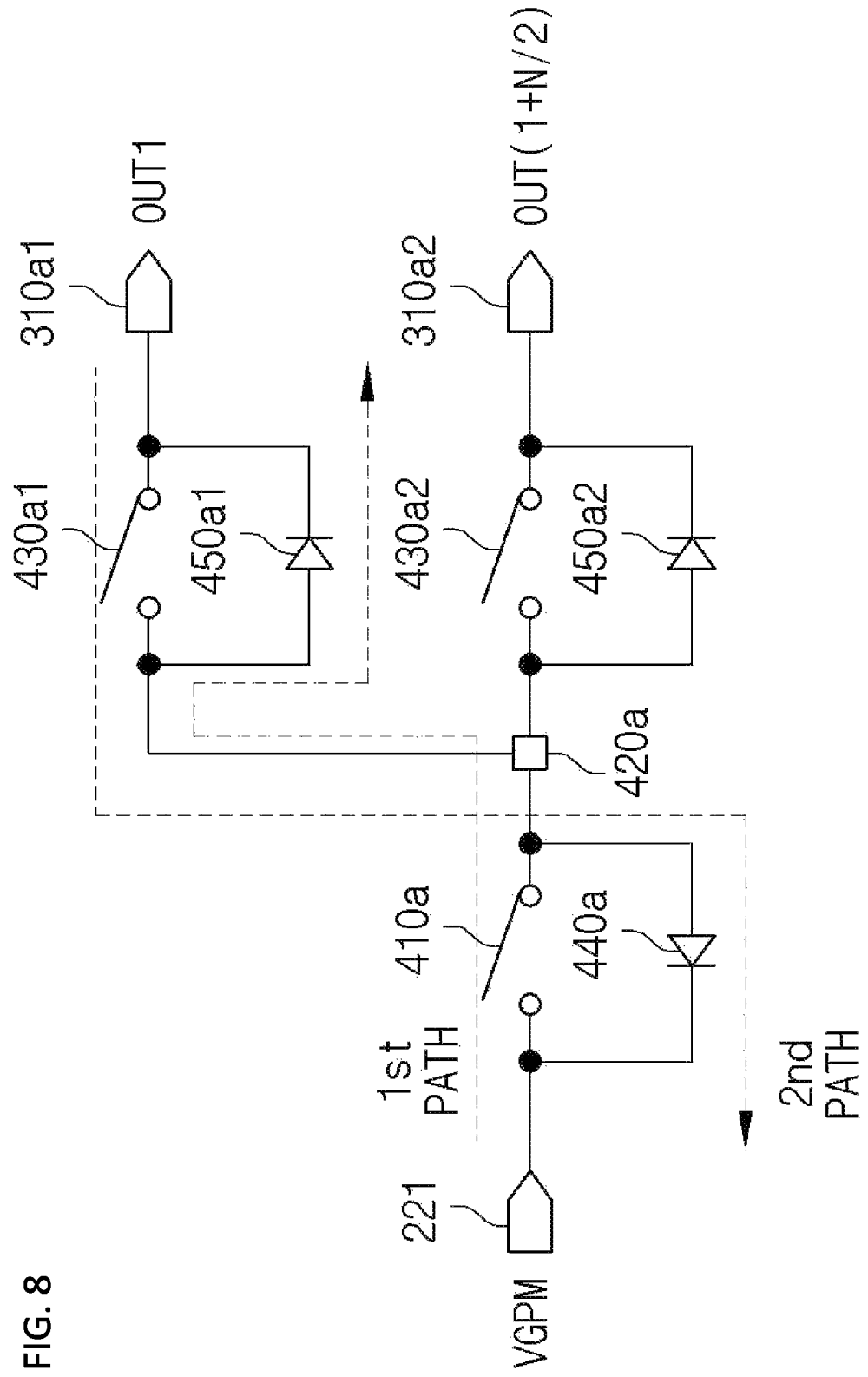
FIGS. 8 and 9 are circuit diagrams for explaining an operation of a gate pulse modulator.
Figure 9:
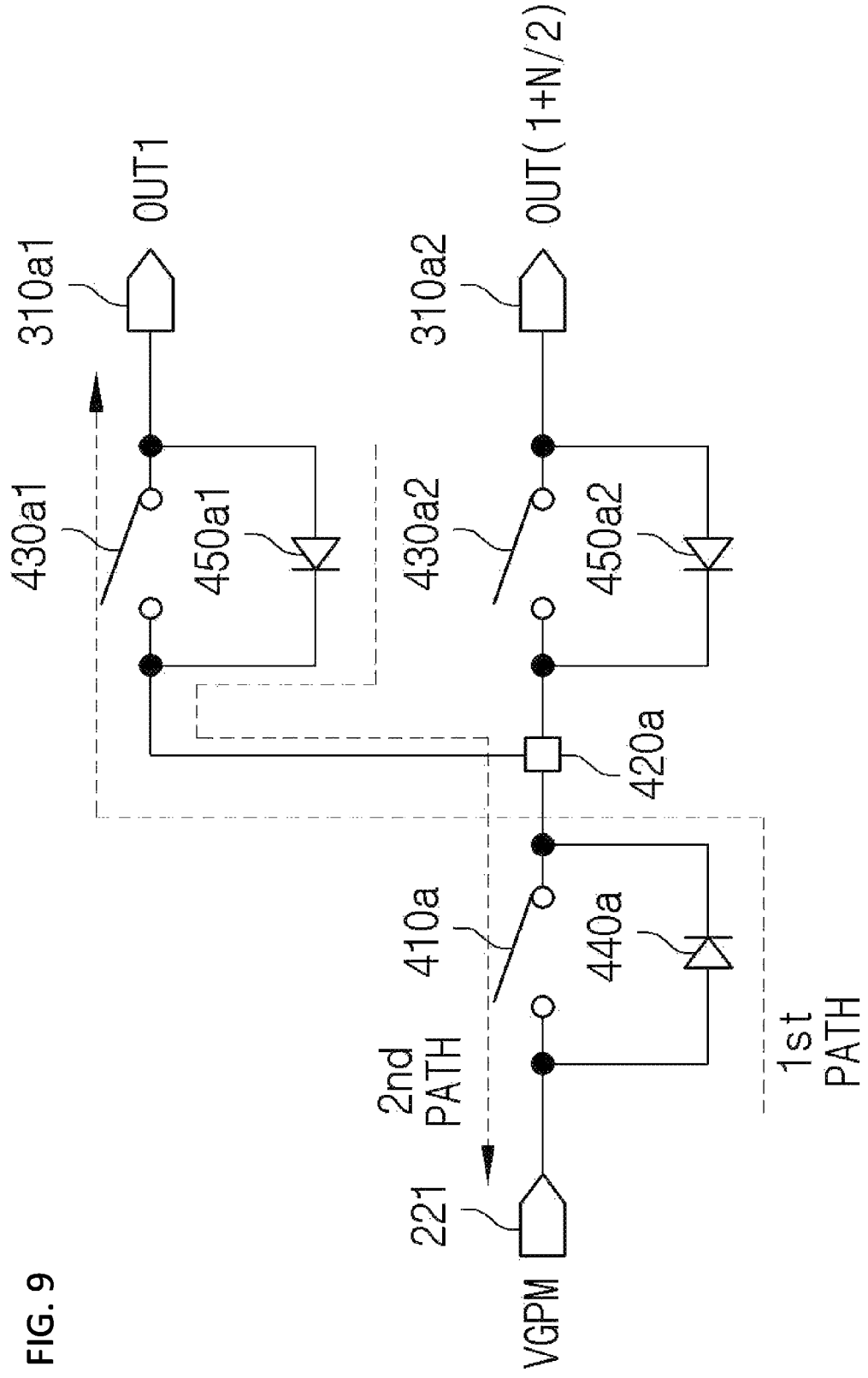

FIG. 8 and FIG. 9 are circuit diagrams for explaining the operation of the gate pulse modulator 220. Diodes in FIG. 8 and FIG. 9 may be understood as parasitic diodes formed in the switches, and are equivalently expressed in order to describe current paths. In FIG. 8, a first diode of the first switch included in the first switch group 410 is formed in a forward direction for the gate pulse modulation terminal 221, and a second diode of the second switch included in the second switch group 430 is formed in a forward direction for the output terminal of the level shifter 210.

The gate pulse modulator 220 may modulate a pulse outputted from the level shifter 210 such that the pulse passes through the reference voltage VGPM in a first process in which the pulse is shifted from the first voltage VGL to the second voltage VGH and a second process in which the pulse is shifted from the second voltage VGH to the first voltage VGL.

With reference to FIG. 8, a description will be provided for the operation of the gate pulse modulator 220, which corresponds to the first process and the second process for a pulse outputted to the output terminal 310a of the level shifter 210, that is, the OUT1.

In FIG. 8, in the case of entering the first process, a first path 1$^{st}$ PATH including the first switch 410a, the common node 420a, and a second internal diode 450a1 is activated in the gate pulse modulator 220. The path by the second internal diode 450a1 may be understood based on the diode characteristics of the second switch 430a1. Accordingly, in the case of entering the first process, the first path 1$^{st}$ PATH including the first switch 410a, the common node 420a, and the path by the diode characteristics of the second switch 430a1 is activated in the gate pulse modulator 220.

During the first process, a pulse of the level shifter 210 is in a first voltage state. At this time, the reference voltage VGPM is provided to the output terminal 310a of the level shifter 210 through the activated first path, and thus a modulated gate pulse provided to the gate driver 140 is shifted from the first voltage to the reference voltage VGPM in correspondence with the first process, and has a waveform that maintains the reference voltage VGPM for a predetermined time. When the activation of the first path is ended, the pulse of the level shifter 210 is in a second voltage state. Accordingly, the modulated gate pulse provided to the gate driver 140 is shifted from the reference voltage VGPM to the second voltage, and has a waveform that maintains the second voltage.

In the case of entering the second process, a second path 2$^{nd}$ PATH including the second switch 430a1, the common node 420a, and a first internal diode 440a is activated in the gate pulse modulator 220. The path by the first internal diode 440a may be understood based on the diode characteristics of the first switch 410a. Accordingly, in the case of entering the second process, the second path 2$^{nd}$ PATH including the second switch 430a1, the common node 420a, and the path by the diode characteristics of the first switch 410a is activated in the gate pulse modulator 220.

During the second process, a pulse of the level shifter 210 is in a second voltage state. At this time, the reference voltage VGPM is provided to the output terminal 310a of the level shifter 210 through the activated second path, and thus a modulated gate pulse provided to the gate driver 140 is shifted from the second voltage to the reference voltage VGPM in correspondence with the second process, and has a waveform that maintains the reference voltage VGPM for a predetermined time. When the activation of the second path is ended, the pulse of the level shifter 210 is in a first voltage state. Accordingly, the modulated gate pulse provided to the gate driver 140 is shifted from the reference voltage VGPM to the first voltage, and has a waveform that maintains the first voltage.

Differently from FIG. 8, in FIG. 9, the first diode of the first switch included in the first switch group 410 and the second diode of the second switch included in the second switch group 430 are formed in a forward direction for the common node.

In FIG. 9, in the case of entering the first process, a first path 1$^{st}$ PATH including the first internal diode 440a, the common node 420a, and the second switch 430a1 is activated in the gate pulse modulator 220. That is, the first path 1$^{st}$ PATH including the path by the diode characteristics of the first switch 410a, the common node 420a, and the second switch 430a1 is activated.

In the case of entering the second process, a second path 2$^{nd}$ PATH including the second internal diode 450a1, the common node 420a, and the first switch 410a is activated in the gate pulse modulator 220. That is, the second path 2$^{nd}$ PATH including the path by the diode characteristics of the second switch 430a1, the common node 420a, and the first switch 410a is activated.

While various embodiments have been described above, it will be understood to those skilled in the art that the embodiments described are by way of example only. Accordingly, the disclosure described herein should not be limited based on the described embodiments.

What is claimed is:

1. A pre-driver comprising:
a level shifter including first and second output terminals which respectively output first and second pulses to have a phase difference, the first and second pulses respectively having first and second voltages; and
a gate pulse modulator including a first switch to which a reference voltage having a level between the first voltage and the second voltage is applied and first second and second second switches which are commonly connected to the first switch, the first second switch being connected to the first output terminal and the second second switch being connected to the second output terminal, the gate pulse modulator being configured to provide the reference voltage to the first output terminal through the first switch and the first second switch in correspondence to shift of the first pulses, and provide the reference voltage to the second output terminal through the first switch and the second second switch in correspondence to shift of the second pulses,
wherein modulated gate pulses generated as the first and second pulses are modulated by the reference voltage are outputted.

2. The pre-driver according to claim 1, wherein the gate pulse modulator is configured such that the first first and second second switches are respectively connected to the first and second output terminals which output pulses of which gate enable periods do not overlap.

3. The pre-driver according to claim 1, wherein the gate pulse modulator is configured such that the first second and second second switches are connected to the first and second output terminals of the level shifter that outputs 4, 6 or 8 phase pulses.

4. The pre-driver according to claim 3,
wherein one or more first second switches are respectively configured for one or more first output terminals through which the first pulses are outputted first, and
wherein one or more second second switches are respectively configured for one or more second output terminals through which the second pulses delayed from the first pulses are outputted.

5. The pre-driver according to claim 4, wherein the first second and second second switches are configured in the first output terminal and the second output terminal which output the first pulses and the second pulses of which gate enable periods do not overlap.

6. The pre-driver according to claim 1, wherein the gate pulse modulator controls paths such that the reference voltage is provided to the pulses in a first process in which the first and second pulses shift from a first level to a second level and a second process in which the first and second pulses shift from the second level to the first level.

7. The pre-driver according to claim 6, wherein the gate pulse modulator provides any one of a first path which includes the first switch and a path by a diode characteristic of the first second switch and a second path which includes a path by a diode characteristic of the first switch and the first second switch, to the first output terminal in correspondence to the first process and the second process.

8. The pre-driver according to claim 7, wherein the gate pulse modulator provides the first path in correspondence to the first process and provides the second path in correspondence to the second process.

9. The pre-driver according to claim 7, wherein the gate pulse modulator provides the second path in correspondence to the first process and provides the first path in correspondence to the second process.

10. The pre-driver according to claim 1, wherein the gate pulse modulator performs gate pulse modulation for the first pulses which are outputted first among pulses sequentially delayed and outputted, by using the first second switch, and performs gate pulse modulation for the second pulses which are outputted from others, by using the second second switch.

11. The pre-driver according to claim 10, wherein the gate pulse modulator comprises the first second switch and the second second switch, which are connected to the first switch, respectively connected to the first and second output terminals which output the first pulse and the second pulse of which gate enable periods do not overlap.

12. A power circuit comprising:
a power unit configured to provide a first voltage, a second voltage, and a reference voltage which has a level between the first voltage and the second voltage; and
a pre-driver configured to output modulated gate pulses by using the first voltage, the second voltage and the reference voltage,
the pre-driver comprising:
a level shifter including first and second output terminals which respectively output first and second pulses to have a phase difference, the first and second pulses respectively having the first and the second voltages; and
a gate pulse modulator including a first switch to which the reference voltage is applied and first second and second second switches which are commonly connected to the first switch, the first second switch being connected to the first output terminal and the second second switch being connected to the second output terminal, the gate pulse modulator being configured to provide the reference voltage to the first output terminal through the first switch and the first second switch in correspondence to shift of the first pulses and provide the reference voltage to the second output terminal through the first switch and the second second switch in correspondence to shift of the second pulses,
wherein the pre-driver outputs modulated gate pulses generated as the first and second pulses are modulated by the reference voltage.

13. The power circuit according to claim 12, wherein the power unit and the pre-driver are configured as one chip and output the modulated gate pulses in correspondence to a timing signal which is provided from a timing controller.

14. The power circuit according to claim 12, wherein the gate pulse modulator is configured such that the first second and second second switches are respectively connected to the first and second output terminals which output pulses of which gate enable periods do not overlap.

15. The power circuit according to claim 12,
wherein one or more first second switches are respectively configured for one or more first output terminals through which the first pulses are outputted first, and
wherein one or more second second switches are respectively configured for one or more second output terminals through which the second pulses delayed from the first pulses are outputted.

16. The power circuit according to claim 15, wherein the first second and second second switches are configured in the first output terminal and the second output terminal which output the first pulses and the second pulses of which gate enable periods do not overlap.

17. The power circuit according to claim 12, wherein the gate pulse modulator controls paths such that the reference voltage is provided to the pulses in a first process in which the first and second pulses shift from a first level to a second level and a second process in which the first and second pulses shift from the second level to the first level.

18. The power circuit according to claim 17, wherein the gate pulse modulator provides any one of a first path which includes the first switch and a path by a diode characteristic of the first second switch and a second path which includes a path by a diode characteristic of the first switch and the first second switch, to the first output terminal in correspondence to the first process and the second process.

19. The power circuit according to claim 12, wherein the gate pulse modulator performs gate pulse modulation for the first pulses which are outputted first among pulses sequentially delayed and outputted, by using the first second switch, and performs gate pulse modulation for the second pulses which are outputted from others, by using the second second switch.

20. The power circuit according to claim 19, wherein the gate pulse modulator comprises the first second switch and the second second switch, which are connected to the first switch, respectively connected to the first and second output terminals which output the first pulse and the second pulse of which gate enable periods do not overlap.

* * * * *